United States Patent [19]

Kenney

[11] 3,950,570
[45] Apr. 13, 1976

[54] METHOD OF DEPOSITING A METAL ON A SURFACE
[75] Inventor: John Thomas Kenney, Lawrence Township, Mercer County, N.J.
[73] Assignee: Western Electric Company, Inc., New York, N.Y.
[22] Filed: May 2, 1974
[21] Appl. No.: 466,314

[52] U.S. Cl. .................. 427/98; 427/305; 427/306; 96/36.2; 96/38.4; 96/48 PD
[51] Int. Cl.² ...................... B44D 1/18; G03C 5/00
[58] Field of Search ............... 96/38.4, 48 PD, 36.2; 117/212, 130 E; 427/98, 305, 306

[56] References Cited
UNITED STATES PATENTS
2,427,443   9/1947   Cochran ................................. 96/48
3,791,340   2/1974   Ferrara ............................. 117/130 E Primary Examiner—John D. Welsh
Attorney, Agent, or Firm—J. Rosenstock

[57] ABSTRACT
A method of depositing a metal on a surface of a substrate is disclosed. A surface of the substrate is sensitized with a photosensitive sensitizer comprising a photosensitive species of (1) an element selected from Ni, Mn, U, Mo and W, or (2) a combination of elements comprising Pd and an element selected from In and Ce. The sensitized surface is exposed to a suitable source of radiation, e.g., ultraviolet radiation, to delineate a surface pattern, corresponding to a desired metal pattern, containing a species of at least one selected element which is either (1) capable of reducing an activation metal ion to catalytic activating metal or (2) capable of being reduced to a catalytic activating metal such as catalytic palladium. The ultraviolet radiation-delineated surface pattern is then exposed or treated with a solution comprising an activating metal ion to reduce and deposit thereon an activating metal. The deposited activating metal pattern is then exposed, as by immersion, to a suitable electroless metal deposition solution wherein an electroless metal is catalytically reduced on the activating metal pattern. However, where Pd-In, Pd-Ce sensitizers are employed, exposure to an activating metal ion containing solution is unnecessary and the delineated surface pattern is directly exposed to the electroless metal deposition solution.

24 Claims, 2 Drawing Figures

METHOD OF DEPOSITING A METAL ON A SURFACE

BACKGROUND OF THE INVENTION

1. Field of the Invention

This invention relates to a method of depositing a metal on a surface and more particularly, to a photographic-like method of depositing a metal pattern on an insulative surface utilizing a sensitizer selected from the group comprising a photosensitive indium-palladium sensitizer, a photosensitive cerium-palladium sensitizer, a photosensitive nickel sensitizer, a photosensitive manganese sensitizer, a photosensitive uranium sensitizer, a photosensitive molybdenum sensitizer and a photosensitive tungsten sensitizer.

2. Description of the Prior Art

Various methods for producing metallic patterns on substrates to produce the circuit boards are similarly well known. These methods include, alone or in various combination, positive and negative printing processes, positive and negative silk-screening processes, positive and negative etching techniques, electroplating and electroless plating.

Electroless plating has found great favor with many workers in the art and has, in fact, been known in at least rudimentary form since before 1845 (see *Symposium on Electroless Nickel Plating*, published by the American Society for Testing Materials as ASTM Special Technical Publication, No. 265 in November of 1959).

Generally speaking, electroless plating requires a so-called catalization step during which a substrate surface to be electrolessly plated with a metal has placed thereon a material, usually a metal salt. This metal salt is capable of reducing the plated metal from an electroless bath without the use of an electrical current. Catalization by such a material is referred to as such because the materials used, usually the salts of the precious metals (palladium, platinum, gold, silver, iridium, osmium, ruthenium and rhodium) serve as reduction catalysts in the autocatalytic electroless plating process. Often, catalization is characterized as providing "nulceating sites" onto which the plated metal is "brought down" by a chemical reduction, or more generally, by a redox reaction. See, for example U.S. Pat. Nos. 3,119,709 and 3,011,920.

Refinements of the basic electroless plating technique are necessary when the plated metal is electrolessly plated onto selected portions of a substrate surface in a pattern, rather than on the entire surface, to produce a circuit board. One such refinement is the additive, photoselective metal deposition process of M. A. DeAngelo at al., U.S. Pat. No. 3,562,005.

In the DeAngelo at al, additive process of metallic pattern generation, patterns are generated without etching or photoresist masking. Specifically, a solution, called a "photopromoter" which has (or at least a part of which has) the ability to be retained on a substrate is applied to the substrate. The "photopromoters" revealed in DeAngelo et al. are solutions comprising either Sn, Ti, Pb, Fe or Hg ions. The retained photopromotor (Sn, Ti, Pb, Fe or Hg ion containing) has a photopromoter species, i.e., the respective metal ion, which is capable of changing oxidation state upon exposure thereof to appropriate radiation. In one oxidation state (but not both) the photopromoter species is able to reduce, from a salt solution thereof, a precious metal (there defined as palladium, platinum, gold, silver, osmium, indium, iridium, rhenium or rhodium). The precious metal is capable of initiating an autocatalytic plating process.

After the substrate retains some of the photopromoter, it is selectively exposed to the appropriate radiation, specifically ultraviolet radiation of short wavelength and below 3,000 A. This exposure renders some portions of the substrate able to reduce the precious metal and rendering other portions not so capable. Subsequently, electroless metal is deposited only where it is desired, i.e., on the reduced precious metal.

Some potential photopromoters do not exhibit "practical wetting" of desirable substrates. "Practical wetting" is defined as the ability of a substrate to retain, on a substantially macroscopically smooth, unroughened portion thereof, a continuous, thin, uniform layer of a liquid, such as water or other liquid medium, when the surface is held vertically, or in any other orientation. To eliminate this problem, the novel DeAngelo et al. additive process of metallic pattern generation may be employed with the novel method of J. T. Kenney, U.S. Pat. No. 3,657,003, which disclosed methods of rendering a non-wettable surface wettable, so that all the DeAngelo et al. photopromoters can be used therewith. A method of wetting a hydrophobic surface while at the same time rendering such surface photosensitive, for photopatterning thereof and for an ultimate electroless metal deposition, is desired and is an object of the subject invention.

SUMMARY OF THE INVENTION

This invention relates to a method of depositing a metal on a surface and more particularly, to a photographic method of depositing a metal pattern on an insulative surface utilizing a photosensitive sensitizer selected from the group comprising a photosensitive indium-palladium sensitizer, a photosensitive cerium-palladium sensitizer, a photosensitive nickel sensitizer, a photosensitive manganese sensitizer, a photosensitive uranium sensitizer, a photosensitive molybdenum sensitizer and a photosensitive tungsten sensitizer.

A surface of a suitable substrate is sensitized with either (1) a positive sensitizer comprising a photosensitive species of an element selected from Ni, Mn, U, Mo, W and mixtures thereof, or (2) a negative sensitizer comprising a photosensitive species resulting from a combination of elements comprising Pd and an element selected from In, Ce and mixtures thereof. The sensitized surface is then selectively exposed to a suitable source of radiation to delineate a surface pattern (unexposed for the positive sensitizer, exposed for the negative sensitizer) corresponding to a desired electroless metal pattern.

When positive sensitizers are employed, the selectively radiation-exposed surface pattern is exposed to an activating metal ion to reduce and deposit an activating metal thereon. The activating metal-deposited pattern may then be treated with a suitable electroless metal deposition solution, to catalytically (by the deposited activating metal) reduce an electroless metal on the delineated pattern. When negative sensitizers are employed, the selectively ultraviolet radiation-exposed surface is exposed directly to a suitable electroless metal deposition solution, comprising a suitable reducing agent, and metal ions destined to be reduced, to catalytically reduce an electroless metal on the delineated pattern. The resultant electroless metal-deposited pattern may be further built up by a conventional electrodeposition and the resultant metal deposit may be used as a circuit pattern of a circuit board.

DESCRIPTION OF THE DRAWINGS

The present invention will be more readily understood by reference to the following drawing taken in conjunction with the detailed description, wherein.

DETAILED DESCRIPTION

The present invention will be discussed primarily in terms of depositing Cu and Ni on a surface of an insulative substrate. It will be readily appreciated that the inventive concept is equally applicable to depositing other suitable metals, which are catalytically reduced from their respective ions by catalytic activating metals (Pt, Pd, Ag).

Figure 1:
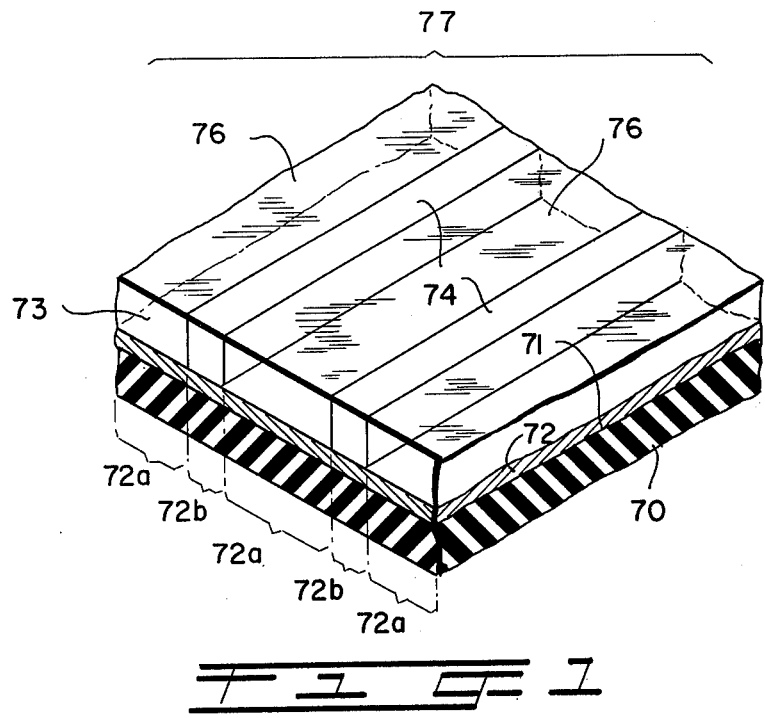
FIG. 1 is a partial isometric view of a portion of a typical substrate having a surface coated with a photosensitive sensitizer layer of the present invention.

Referring to FIG. 1, there is shown a portion of a suitable substrate 70. For the production of electrical circuit patterns, suitable substrates are those which are generally nonconductive. In general, all dielectric materials are suitable substrates. The substrate 70 is sensitized by applying either a suitable positive photosensitive sensitizer or a suitable negative photosensitive sensitizer to a surface 71 of the substrate 70 to form a photosensitive sensitizer layer or coat 72 (greatly enlarged for illustrative purposes only).

A suitable positive photosensitive sensitizer is defined herein as comprising a sensitizing species of an element selected from the group comprising Ni, Mn, U, Mo, W and mixtures thereof, which in its initial state is capable of reducing an activating metal ion to an activating metal, e.g., Pd, Pt, Ag, but which upon exposure to a suitable source of radiation, e.g., ultraviolet radiation, is rendered incapable of reducing an activating metal ion to an activating metal. A suitable negative photosensitive sensitizer on the other hand is one comprising a sensitizing species resulting from a combination of elements comprising Pd and an element selected from the group comprising In, Ce and mixtures thereof, which in its initial state is incapable of participating in an electroless metal deposition catalysis, e.g., by subsequently forming catalytic palladium metal, but is rendered so capable upon exposure to a source of ultraviolet radiation.

Suitable positive photosensitive sensitizers have been found to be colloidal solutions containing a species of one of the elements Ni, Mn and U, where the species exist as ionic nickel, manganese and uranium, respectively (associated, e.g., as insoluble particles of a hydrous oxide of Ni, Mn, U, respectively, or dissociated, e.g., as ionized Ni, Mn, U ions, respectively, e.g., $Ni^{+2}$, or as a mixture of both). Some typical solutions, which act as positive photosensitive Ni, Mn and U sensitizers, respectively, are colloidal Ni, Mn and U solutions comprising an insoluble nickelous, manganous and uranous hydrous oxide, respectively. Such solutions are formed by a controlled hydrolysis and nucleation reaction in an aqueous medium wherein colloidal particles of the colloidal solution (1) have a size within the range of 10A to 10,000A and (2) comprise the insoluble hydrous oxide of nickel ($Ni^{+2}$), manganese ($Mn^{+2}$) and uranium ($U^{+4}$), respectively. The term hydrous oxide is as defined in Kenney, U.S. Pat. No. 3,657,003, assigned to the assignee hereof and incorporated by reference herein, namely as an insoluble oxide, an insoluble hydroxide, an insoluble oxide-hydroxide or an insoluble mixture of an oxide and a hydroxide.

Moreover, the term "hydrous oxide" as used herein is intended to include all permutations and combinations of one or more of the following type of oxides and/or hydroxides:

1. True Hydrous Oxides — Those oxides which include an indefinite amount of $H_2O$ in other than stochiometric fashion. That is, a salt of a selected element + hydrous $H_2O$.

2. True Hydroxides — Those compounds of a salt which contain actual OH-groups. That is, a salt of a selected element + only sufficient stochiometric $H_2O$ to form a hydroxide.

3. Hydrous Hydroxides — True hydroxides which also contain hydrous $H_2O$ in indefinite amounts. That is, a salt of a selected element + stochiometric $H_2O$ necessary to form a hydroxide + hydrous $H_2O$.

4. Hydrous Hydrates — A salt of a selected element + some of the stochiometric $H_2O$ necessary to form a hydroxide + hydrous $H_2O$.

A more detailed explanation of the term "hydrous oxide" is contained in *Inorganic Colloid Chemistry* by H. B. Weiser, Vol II. "The Hydrous Oxides and Hydroxides," Chapter I, John Wiley and Sons, Inc., New York (1935); and *Inorganic Chemistry, An Advanced Textbook*, by T. Moeller, John Wiley and Sons, Inc., New York (1952); and *Advanced Inorganic Chemistry*, by F. A. Cotton and G. Wilkinson, John Wiley and Sons, Inc., New York (1972).

It should be noted that the term "hydrous $H_2O$" refers to water carried by the compound in other than stochiometric fashion. Specifically, such water is probably not carried in chemical fashion but is rather surface sorbed, occluded or held as a part of the unit crystal.

The hydrolysis reaction includes dissolving a salt of the respective element (Ni, Mn, U) in the aqueous medium and maintaining the pH of the aqueous medium at a point where no flocculate results.

Generally, these photosensitive nickel, manganese and uranium colloidal sensitizer solutions are prepared in the same way as other hydrous oxide wetting solutions, described in Kenney, are prepared. Specifically, a salt of the element, e.g., $Ni(NO_3)_2$, $NiCl_2$, $Ni(C_2H_3O_2)_2 \cdot 4H_2O$, $Mn(NO_3)_2$, $UCl_4$, is selected and dissolved in an aqueous medium. It is to be noted that uranium metal may be employed and dissolved in an aqueous univalent acid, e.g., HCl, to form a $U^{+4}$ salt. Alternatively, $UO_2(NO_3)_2$ may be dissolved in the aqueous medium and then reduced to the $U^{+4}$ oxidation state by a suitable reducing agent, e.g., hydrazine. Prior to the dissolution in the aqueous medium, the pH and/or temperature of the aqueous medium are adjusted, if necessary, so that when the salt is dissolved therein, no precipitate or flocculate results. The salt is then dissolved therein. The pH and/or temperature of the resultant solution are now adjusted, again if necessary, a hydrolysis and nucleation reaction being thereby permitted to occur at a given rate, for a given time, during which time insoluble colloidal particles of the hydrous oxide of the element (Ni, Mn, U) are generated, as for example $U(OH_4)$, $U_3O_8$. The resultant Ni and U species containing solutions are exceedingly stable against air oxidation and are therefore very suitable for inventory purposes.

It is to be pointed out and stressed at this point that it is critical that the positive photosensitizers of Ni, Mn and U exist in a colloidal state, if such is not the case, then the Ni and/or Mn and/or U sensitizers cannot function photochemically, i.e., they are not photosensitive in the manner described above.

Other suitable positive photosensitizers include non-colloidal aqueous wetting solutions containing dissolved salts selected from tungstates, e.g., sodium tungstate, potassium tungstate, and molybdates, e.g., sodium molybdate, potassium molybdate, ammonium molybdate, etc. It is to be noted that these salts are not only photosensitive, but function so as to render a hydrophobic surface, e.g., polyethyleneterephthalate, polytetrafluoroethylene, etc., hydrophilic in a mamnner similar to that revealed in Kenney, U.S. Pat. No. 3,657,003, incorporated herein. It is to be noted and stressed that unlike the colloidal wetting solutions revealed in U.S. Pat. No. 3,657,003 the tungstate and molybdate wetting solutions revealed herein are non-colloidal.

The tungstate and molybdate wetting solutions and sensitizers are prepared by dissolving a selected salt, e.g., $Na_2MoO_4 \cdot 2H_2O$, $Na_2WO_4 \cdot 2H_2O$, in an aqueous medium in a concentration typically ranging from 0.1 to 5 weight percent and then acidifying the resultant solution in the presence of a suitable reducing agent, e.g., $Sn^{+2}$ ions, $Fe^{+2}$ ions, $Zn^0$, $Cr^{+2}$ ions, $Ti^0$, $Mo^0$, $NaH_2PO_2 \cdot H_2O$, $N_2H_4$, etc. The solution is acidified to a pH which typically ranges from 0.0 to 4.0 whereby a blue wetting solution comprising either a mixed $Mo^{+5}$—$Mo^{+6}$ hydrous oxide species or complex or a mixed $W^{+5}$—$W^{+6}$ hydrous oxide species or complex, which renders a hydrophobic surface hydrophilic, results. This blue solution functions also as a positive photosensitive sensitizer.

Alternatively, the tungstate and molybdate wetting solutions can be prepared by dissolving either tungsten or molybdenum metal in a suitable acid, e.g., aqueous HCl, to form a $Mo^{+5}$ or $W^{+5}$ salt (hydrous oxide), respectively, which is then oxidized by a suitable oxidizing agent, e.g., $KMnO_4$, $K_2Cr_2O_7$, etc., to the blue, non-colloidal wetting solution and positive sensitizer (at a pH of about 0.0 to about 4.0), comprising mixed $^{+5}$ — $^{+6}$ oxidation state species.

It is to be noted that the mixed oxidation states ($^{+5}$, $^{+6}$) of molybdenum give an intense blue color. However, upon complete reduction to $Mo^{+5}$, at a pH of 0.0 or lower, a red solution results. Upon addition of a univalent base, e.g., NaOH, to a pH of about 0.9 to about 1.2 a brown colloidal solution results which is a wetting photosensitive sensitizer. A $Mo^{+5}$ containing photosensitive hydrous oxide is therefore obtained.

A hydrophobic surface is immersed in the resultant wetting solutions until it is wet thereby and is then removed. The wetting may occur quite quickly or require prolonged immersion, depending upon the particular surface immersed. The time of immersion, however, may be easily ascertained experimentally, for each hydrophobic surface employed, by one skilled in the art in the light of the disclosure contained herein.

The resultant tungstate and molybdate sensitizers are very stable to air oxidation and are therefore very suitable for inventorying purposes. This is especially true when the tungstate or molybdate sensitizers are applied to the surface 71 to form a layer or coat 72 (FIG. 1).

Ordinarily the Ni, Mn, U, Mo and W species contained in the respective photosensitive sensitizer layer or coat 72 (FIG. 1) is capable of reducing an activating metal ion, e.g., $Pd^{+2}$, $Pt^{+2}$, $Ag^{+1}$, to an activating metal, e.g., $Pt^0$, $Pd^0$, $Ag^0$. Upon exposure, however, to a suitable source of ultraviolet radiation the Ni, Mn, U, W, Mo species contained in the respective sensitizer layer 72 (FIG. 1) is no longer capable of reducing an activating metal ion to an activating metal. A suitable souce of ultraviolet radiation being a source of ultraviolet radiation having a wavelength ranging from 1,800A to 3,200A.

Where one employs a colloidal solution comprising a hydrous oxide of U, e.g., $U(OH)_4$, $U_3O_8$, or a hydrous oxide of Mn, the above-described positive sensitizing effect also occurs upon exposure to visible radiation having a wavelength ranging from 2,200A into visible light.

It is to be pointed out that in the case of the Mo and W sensitizers, the ultraviolet radiation oxidizes the $+5$ oxidation state species to the $+6$ oxidation state species.

Suitable negative photosensitive sensitizers have been found to be aged colloidal solutions, having a red color, containing a species of one of the elements indium (In) and cerium (Ce) combined with the element Pd, where the species exists as ionic indium or cerium or palladium (associated, e.g., as insoluble particles of a hydrous oxide of In, Ce, Pd, respectively, or dissociated, e.g., as ionized In, Ce, Pd ions such as $In^{+3}$, $Ce^{+4}$, $Pd^{+2}$, respectively, or as a mixture of both, respectively). Specifically, suitable indium and cerium solutions which act as positive photosensitive sensitizers are aged colloidal indium-palladium and cerium wetting solutions, which are generally described as stable colloidal solutions formed by a controlled hydrolysis and nucleation reaction in an aqueous medium wherein colloidal particles of the colloidal wetting solution (1) have a size within the range of 10A to 10,000A and (2) comprise an insoluble hydrous oxide of either palladium or indium or cerium or combined palladium (Pd-In, Pd-Ce) or mixtures thereof. Again, the term "hydrous oxide" is as defined in Kenney, referred to above. The hydrolysis reaction includes dissolving a salt of each of the combined elements in the aqueous medium and maintaining the pH of the aqueous medium at a point where no flocculate results.

It is hypothesized that the colloidal hydrous oxide sensitizing species (aged) comprises a colloidal complex having a general structural formula of

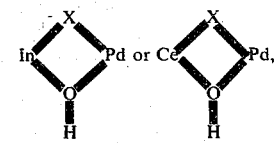

respectively, where X is a radical derived from the In or Ce or Pd species or salt, e.g. $InCl_3$, $CeCl_3$, $PdCl_2$, upon which the controlled hydrolysis and nucleation reaction in an aqueous medium takes place. Typically, X may be a halogen radical, e.g., Cl, Br, a hydroxide radical )OH), an ammonium radical ($NH_3$), etc.

In support of this hypothesis, it is to be noted that the suitable colloidal In-Pd and Ce-Pd wetting solutions which function as negative sensitizers are red in color whereas (1) a colloidal solution comprising a hydrous oxide of Pd (without either In or Ce) is normally brown in color, (2) a colloidal solution comprising a hydrous oxide of In (without Pd) is normally whitish in color and (3) a colloidal solution comprising a hydrous oxide of Ce (without Pd) is of an orange-yellow color.

Generally, these photosensitive indium-palladium and cerium-palladium colloidal sensitizer solutions are prepared in the same way as other hydrous oxide wetting solutions, described in Kenney, are prepared. Typically, a palladium salt, e.g., PdCl$_2$, is selected and combined with a selected In or Ce salt, e.g., InCl$_3$, Ce(NH$_4$)$_2$ (NO$_3$)$_2$. The salts are combined in an aqueous medium wherein dissolution occurs. Prior to such dissolution, the pH and/or temperature of the aqueous medium are adjusted, if necessary, so that when either or both of the salts is dissolved therein, no precipitate or flocculate results. The salt or salts are then dissolved therein. The pH and/or temperature of the resultant solution are now adjusted, again if necessary, whereby a hydrolysis and nucleation reaction is permitted to occur at a given rate, for a given time, during which time insoluble colloidal particles of the hydrous oxide of palladium or indium or cerium or combined Pd (Pd-In, Pd-Ce) or a mixture thereof are generated.

When freshly prepared (not aged), the indium-palladium or the cerium-palladium solutions exhibit positive sensitizer ability, similar to that described for the colloidal palladium sensitizers described in U.S. Pat. No. 3,791,340, assigned to the assignee hereof, incorporated by reference herein. Specifically, the indium-palladium species or the cerium-palladium species contained in the respective solutions is capable of participating in an electroless metal deposition catalysis, that is, is capable of forming catalytic palladium metal (palladium metal capable of functioning as a reduction catalyst in an autocatalytic electroless process), e.g., by being reduced thereto by a suitable reducing agent such as Sn$^{+2}$ ions or

However, upon exposure to a suitable source of ultraviolet radiation the species contained in either of the solutions is no longer capable of participating in an electroless metal reduction catalysis. Again, a suitable source of ultraviolet radiation having a wavelength ranging from 1,800A to 3,200A.

Upon aging, e.g., typically for 30 minutes at 25°C, both the In-Pd solution and the Ce-Pd solutions, discussed above, are converted into negative sensitizer solutions. The aged In-Pd species or the Ce-Pd species [hypothesized to be either of the complexes described above ] is now incapable of participating in an electroless metal deposition catalysis, i.e., is incapable of forming catalytic palladium metal, i.e., palladium metal capable of functioning as a reduction catalyst in an autocatalytic electroless process, as for example by reduction thereto by a suitable reducing agent such as Sn$^{+2}$ ions or formaldehyde. Upon exposure to a suitable source of ultraviolet radiation, e.g., a source of ultraviolet radiation having a wavelength ranging from 1,800A to 3,200A, the combined Pd species (believed to be a Pd-In or Pd-Ce complex) is converted into a palladium species, e.g., a hydrous oxide of Pd, capable of undergoing such reduction.

There is no firmly established explanation for the above phenomena. It is not definitely known what reaction occurs upon aging which renders an ordinarily reducible palladium species, e.g., a hydrous oxide of Pd, incapable of being reduced to catalytic palladium metal. It is difficult to conceive what possible product or palladium species is obtained which cannot be reduced by a suitable reducing agent such as formaldehyde

[alone or combined in an electroless plating solution], to catalytic palladium metal, However, the product obtained by aging the In-Pd or Ce-Pd colloidal solutions, is one which is not reduced by a reducing agent, such as

(alone or combined in an electroless plating solution), to catalytic palladium metal. The resultant aged product (unexposed to ultraviolet radiation) is not capable of participating in any fashion in the catalytic reduction of an electroless metal ion.

As revealed above, it has been hypothesized that the palladium ions are tied up in a complex. It is also hypothesized that the complex cannot take part in a redox reaction with formaldehyde, for example, without first being broken up in some fashion by an input of energy from an ultraviolet radiation source. However, it is to be stressed that the above explanation is a hypothesis and the subject invention is not to be limited thereby.

The degree of aging has not been found to be critical. However, an aging of at least 30 minutes at 250°C is typically required. It is to be noted that the aging period and temperature are readily ascertained experimentally by one skilled in the art in the light of the subject invention disclosed herein.

It is to be noted and stressed at this point, that the In-Pd and Ce-Pd solutions (fresh and aged) must exist in a colloidal state in order to function in the manner described, i.e., both as positive and negative photosensitizers.

Referring again to FIG. 1, the substrate 70 is sensitized, as for example by immersion in the selected sensitized solution, for a period of time sufficient to yield a sensitizer coat on the surface 71. The time of sensitization, e.g., by immersion, is not critical and is easily ascertained by one skilled in the art in the light of the subject invention disclosed herein. The sensitized substrate 70 may then be water rinsed and is then dried, e.g., air dried, to form the adherent sensitizer layer 72.

A suitable mask 73, e.g., a quartz mask, is placed contiguous to the photosensitive sensitizer layer 72. Where the sensitizer layer 72 comprises a positive photosensitive sensitizer, the mask 73 is a positive mask, i.e., has areas 74 which are opaque to a desired radiation to which the positive mask 73, and, ultimately, layer 72 is destined to be exposed, which areas correspond to a desired electroless metal-deposited pattern. The positive mask 73 has areas 76 which are capable of transmitting therethrough the desired radiation to which the positive mask 73 and layer 72 is destined to be exposed. Conversely, where the sensitizer layer 72 comprises a negative photosensitive sensitizer, the mask 73 is a negative mask, i.e., it has areas 76 which are opaque to the desired radiation and areas 74 are capable of transmitting therethrough the desired radiation. It should be noted that in the alternative, separate masking areas may be applied to layer 72, utilizing standard materials and techniques known in the art.

Where a positive sensitizer is employed, a radiation source 77, e.g., an ultraviolet radiation source having a wavelength ranging from 1,800A to 3,200A, is placed above the mask 73 and directed thereat. A plurality of rays, for example, having a wavelength ranging from 1,800A to 3,200A passes through or is transmitted through areas 76 of the mask 73 to expose areas 72(a) of the positive photosensitive sensitizer (Ni, Mo, U, W, Mo) layer 72 thereto. The thus exposed areas 72(a) of the positive sensitizer layer 72, underlying and corresponding to areas 76 of the positive mask 73, are incapable of reducing an activating metal ion, to which the radiation-exposed substrate 70 is destined to be exposed, to an activating metal. In other words, a first Ni, Mn, U, W, Mo species (ionic) capable of reducing an activating metal ion to an activating metal, contained on areas 76 is transformed into a second Ni, Mn, U, W, Mo, species (ionic), respectively, which is incapable of reducing an activating metal ion to an activating metal. In the case of Mo and W this is $Mo^{+6}$ and $W^{+6}$, respectively, the remaining areas 72(b) of the positive sensitizer (Ni, Mn, U, W, Mo) layer 72, corresponding to areas 74 of the positive mask 73, which have not been exposed, comprise theron at least one of the first Ni, Mn, U, W, Mo species which retains or possesses the ability to reduce an activating metal ion to an activating metal. A sensitizer pattern or outline delineated by ultraviolet radiation exposure or visible radiation in the case of the U species and Mn species, which is capable of reducing an activating metal ion from a typical suitable activating solution, is thus established.

It is to be pointed out at this point, that the surface 71 and thus layer 72 is exposed to the radiation source 77 (ultraviolet or visible where appropriate) for a period of time sufficient to render areas 76 incapable of reducing an activating metal ion to an activating metal. Such a period of time is readily ascertained experimentally by one skilled in the art for a particular ultraviolet or visible (where appropriate) radiation source, in the light of the present invention. It is to be noted, however, that the time of exposure is interdependent upon the intensity of the source 77, i.e., upon the amount of energy transmitted by the source 77 to the surface 71. This interdependency is well known in the art or is easily ascertained by one skilled therein. The amount of energy supplied to the substrate surface 71 by the source 77, however, is not found to be critical and a typical exposure may range from 10 to 100 millijoules/cm² (at wavelengths ranging from 1,800A to 3,000A).

Figure 2:
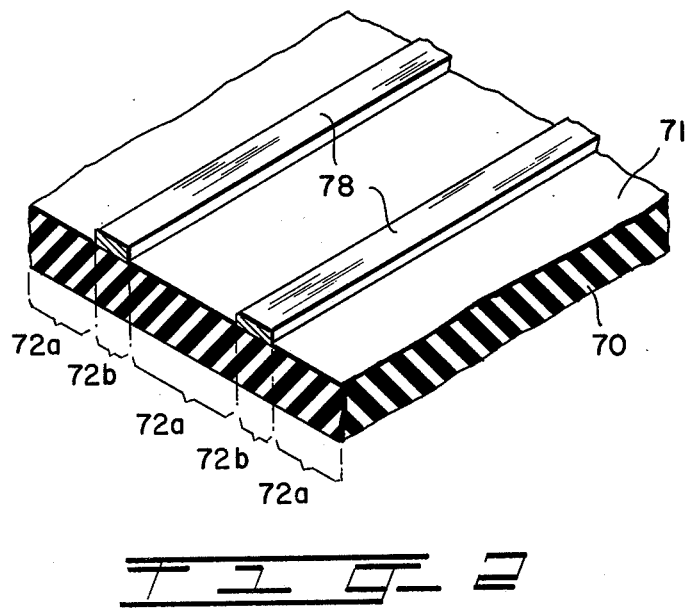
FIG. 2 is a partial isometric view of the portion of the substrate of FIG. 1 after a metallic pattern has been photoselectively deposited thereon by the novel method of the present invention.

The radiation-exposed substrate 70 (positively sensitized) is then activated, i.e., is exposed in a conventional manner, e.g., by immersion, in an activating solution, e.g., an aqueous $PdCl_2$ solution, containing an activating metal ion, e.g., $Pd^{+2}$, wherein the activating metal ion, e.g., $Pd^{+2}$, is reduced to the metal, e.g., $Pd°$, and deposited on areas 72(b) of the substrate 70 in the form of a catalytic activating metal pattern. The patterned, activating metal-deposited substrate 70 may then be water rinsed and is then immersed in a conventional electroless metal deposition solution wherein an electroless metal ion, e.g., $Cu^{+2}$, $Ni^{+2}$, is reduced to the metal, e.g., $Cu°$, $Ni°$ and deposited on areas 72(b) of the substrate 70 to form an electroless metal deposit 78 (as shown in FIG. 2). The electroless metal deposition 78 may then be further built up or electroplated in a standard electroplating bath.

Where a negative sensitizer is employed, the plurality of rays (wavelengths ranging from 1,800A to 3,200A) from the radiation source 77 (FIG. 1), passes through or is transmitted through areas 74 of the mask to expose areas 72(b) of the negative photosensitizer (aged In-Pd or Ce-PD) layer 72 thereto. The thus exposed areas 72(b) of the negative sensitizer layer, underlying and corresponding to areas 74 of the negative mask, are rendered capable of participating in a catalytic reduction of electroless metal ions to which the radiation-exposed substrate 70 is destined to be exposed. In other words, a first palladium containing species, incapable of being reduced to catalytic palladium, contained on areas 72(b) of the negative sensitizer layer 72, corresponding to areas 74 of the negative mask 73, is transformed into a second palladium containing species which is capable of being reduced to catalytic palladium metal. The remaining areas 72(a) of the negative sensitizer (aged In-Pd, Ce-Pd) layer 72, corresponding to areas 76 of the negative mask 73, which have not been exposed, comprise thereon the first palladium containing species (In-Pd, Ce-Pd) which is not capable of reducing an activating metal ion to an activating metal. A sensitizer pattern or outline delineated by ultraviolet radiation exposure which is capable of participating in the catalytic reduction of an electroless metal from a suitable electroless plating solution is thus established.

Again, it is to be noted that the surface 71 and thus layer 72 is exposed to the ultraviolet radiation source 77 for a period of time sufficient to render areas 74 capable of participating in an electroless metal deposition catalysis, whereby the catalytic palladium metal forms which performs such catalysis. Such a period of time is readily ascertained experimentally by one skilled in the art for a particular ultraviolet radiation source in the light of the present invention. Again, it is to be noted that the time of exposure is interdependent upon the intensity of the source 77, i.e., upon the amount of energy transmitted by the source 77 to the surface 71. This interdependency is well known in the art or is easily ascertained by one skilled therein. The amount of energy supplied to the substrate surface 71 by the source 77, however, is not found to be critical and a typical exposure may range from 1 to 100 millijoules/cm² (at wavelengths ranging from 1,800A to 3,000A).

The substrate 70 which has been sensitized with a negative sensitizer and radiation exposed, is directly immersed in a suitable electroless metal deposition solution wherein, sequentially (1) catalytic palladium metal is formed on areas 72(b) and (2) and electroless metal ion, e.g., $Cu^{+2}$, $Ni^{+2}$ is reduced to the metal, e.g., Cu, Ni and deposited on areas 72(b) of the substrate 70 to form the electroless metal deposit 78 (as shown in FIG. 2). A suitable electroless metal deposition solution comprises a metal ion, e.g., $Cu^{+2}$, $Ni^{+2}$ which is catalytically reduced to its corresponding metal, e.g., Cu, Ni, by a suitable reducing agent, e.g.,

Na₂H₂PO₂.H₂O, in the presence of catalytic Pd metal. A suitable reducing agent is one which (1) is capable of reducing an aged palladium ion containing species, which has been exposed to ultraviolet radiation, to catalytic palladium metal and (2) is capable of reducing the electroless metal ions to the corresponding electroless metal.

The resultant electroless metal deposition 78 (FIG. 2) may then be further built up or electroplated in a standard electroplating bath.

It is to be noted that the various typical activators, activating solutions, electroless and electroplating solutions, activating and plating conditions and procedures are well known in the art and will not be elaborated herein. Reference in this regard is made to *Metallic Coating of Plastics*, William Goldie, Electrochemical Publications, 1968.

It is to be noted, that the invention disclosed herein may be employed in the production of electrical circuit patterns on a nonconductive substrate, in a similar fashion to that revealed in U.S. Pat. No. 3,562,005, assigned to the assignee hereof and incorporated by reference herein. In this regard, referring back to FIG. 1, areas 72(b) of the sensitizer layer 72 constitute a portion of a pattern conforming to a desired electrical circuit pattern. Referring to FIG. 2, the electroless deposit 78 obtained constitutes a portion of the electrical circuit pattern. The resulting electrical circuit pattern, represented by deposit 78 may be electroplated to a desired thickness whereafter the desired circuit pattern may be removed from the substrate 70 by appropriate means known in the art.

EXAMPLE I

A. Three colloidal, positive photosensitive sensitizers were prepared by dissolving 0.25 weight percent of Ni(C₂H₃O₂)₂.4H₂O, Ni(NO₃)₂ and NiCl₂, respectively, in water and adjusting the pH to 5.0 to 5.4 with 1N-NaOH (aqueous). Three colloidal solutions comprising colloidal particles of a hydrous oxide of nickel were obtained. A polyethyleneterephthalate film (a hydrophobic material commercially obtained) was immersed in each of the resultant sensitizer solutions for three minutes at 25°C, whereafter the film was removed, rinsed with deionized water for one minute and dried. Each of the three films was then selectively exposed for about two minutes to a low-pressure mercury discharge lamp (0.2$\mu$ watt/cm² intensity, $\lambda$ =2540A, total energy of 200$\mu$ joules/cm²) through a positive mask. The mask had opaque areas through which the ultraviolet radiation did not pass, such opaque areas corresponding to a desired electroless metal-deposited pattern. Each film or substrate was then immersed in an aqueous activating solution comprising 0.05 weight percent PdCl₂.2H₂O (pH = 2.2) for 10 seconds and rinsed in deionized water for one minute. Each film was then immersed in an electroless plating bath, commercially obtained, comprising cupric sulfate, formaldehyde, complexer and caustic wherein an electroless copper pattern corresponding to unexposed areas of each of the films and to opaque areas of the mask, having a thickness of 2–5$\mu$ inches was obtained on each of the three films.

The above procedure was repeated with three additional films except that an electroless nickel plating bath, commercially obtained, comprising a Ni⁺² salt and Na₂H₂ PO₂.H₂O was employed. An electroless nickel pattern having a thickness of 2–5 $\mu$ inch was obtained on each of the three films.

B. The procedure of Example I-A was repeated except that the pH of the resultant solution was adjusted to 8.3 to 8.5 with 10 weight percent aqueous NH₄OH whereby colloidal, positive sensitizers were obtained. Substantially the same results were obtained.

C. The procedures of Example I-A and I-B were repeated except that 0.5 weight percent of each of the respective nickel salts was employed. Substantially the same results were obtained.

D. The procedures of Examples I-A and I-B were repeated except that 1.0 weight percent of each of the respective nickel salts was employed. Substantially the same results were obtained.

E. The procedures of Examples I-A and I-B were repeated except that 2.0 weight percent of each of the respective nickel salts was employed. Substantially the same results were obtained.

EXAMPLE II

A. A colloidal, positive photosensitive sensitizer was prepared by first combining 0.5 to 2 weight percent of Mn(NO₃)₂ with water, 5 percent by volume of HC₂H₃O₂ (98 weight percent), 5 percent by volume of H₂O₂ (30 weight percent in water). The pH of the resultant solution was raised to 5.0 with 0.5 weight percent NH₄OH whereat a black precipitate appeared and redissolved. A colloidal solution comprising colloidal particles of a hydrous oxide of manganese was obtained.

The procedure of Example I-A was then repeated except that the colloidal manganese sensitizer was employed. A 2–5$\mu$ inch thick electroless copper pattern was obtained as well as a 2–5$\mu$ inch thick electroless nickel pattern.

B. The procedure of Example II-A was repeated except that the pH was raised to 8.5 to 9 whereby a colloidal, wetting sensitizer, comprising hydrous oxide particles of Mn, was obtained. Substantially the same results were obtained.

EXAMPLE III

A. The procedure of Example I-A was repeated except that a positive photosensitive sensitizer comprising a uranium species was employed. The positive photosensitizer was prepared by dissolving uranium metal in HCl and then raising the pH to 0.5 and then to 1.0 with 1N aqueous NaOH to obtain a solution having 1.0 weight percent U° dissolved therein. The resultant solution was a colloidal solution comprising colloidal particles of a hydrous oxide of uranium. The resultant solution readily wet the hydrophobic polyethyleneterephthalate film.

A 2–5 $\mu$ inch electroless copper pattern was obtained as well as a 2–5 $\mu$ inch thick electroless nickel pattern.

B. The procedure of Example III-A was repeated except that the pH was raised to 3.40 whereby a positive colloidal sensitizer was obtained which readily wet the hydrophobic polyethyleneterephthalate film.

A 2–5 $\mu$ inch electroless copper pattern was obtained as well as a 2–5 $\mu$ inch thick electroless nickel pattern.

C. The procedure of Example III-A was repeated except that the positive sensitizer was prepared in the following manner. 1.0 weight percent of $UO_2(NO_3)_2 \cdot 6H_2O$ was dissolved in water. $HNO_3$ was added to the solution to raise the pH to about 2.0. Excess zinc metal, needed for reduction, was added to the resultant solution and the pH was then raised with either aqueous NaOH(0.5N) or $NH_4OH$ (0.5N) to 4 to 7 whereby a wetting colloidal solution was obtained which also functions as a positive photosensitive sensitizer.

A 2–5 $\mu$ inch electroless copper pattern was obtained a well as a 2–5 $\mu$ inch thick electroless nickel pattern.

EXAMPLE IV

The procedure of Example I-A was repeated except that positive photosensitive sensitizers and non-colloidal wetting solutions comprising a Mo species were employed. Various non-colloidal Mo wetting solutions, i.e., solutions which render a hydrophobic surface hydrophilic, were prepared in the following manner. Aqueous solutions of $Na_2MoO_4 \cdot 2H_2O$, in a concentration ranging from 0.1 to 5 weight percent were prepared by dissolution in water. The resultant aqueous solutions were then acidified with a univalent acid such as 1N-HCl in the presence of a reducing agent selected from $Sn^{+2}$ ($SnCl_2 \cdot 2H_2O$), $Fe^{+2}$ ($FeCl_2$), $Fe°$, $Zn°$, $Cr^{+2}$ ($CrCl_2$), $Ti°$, $Mo°$, $NaH_2PO_2 \cdot H_2O$, present in a concentration of equivalent weights, whereby blue colored solutions resulted. Over a wide pH range (< 0.0 to > 4.0) the resultant blue solutions each wet a polytetrafluoroethylene and a polyethyleneterephthalate surface, i.e., rendered such hydrophobic surfaces hydrophilic. The resultant solutions did not give a Tyndall effect as compared to colloidal wetting solutions such as those in the examples described above.

Each of the resultant blue solutions, comprising the dissolved molybdate salt, functioned as a positive photosensitive sensitizer. A 2–5 $\mu$ inch electroless copper pattern was obtained as well as a 2–5$\mu$ inch electroless nickel pattern.

EXAMPLE V

The procedure of Example IV was repeated except that the reduction of the molybdenum species was carried out to completion whereby only $Mo^{+5}$ was present and resulted in a non-colloidal red solution which was not capable of wetting either the polyethyleneterephthalate surface or the polytetrafluoroethylene surface. The pH of the red solution was then raised to about 0.9 to about 1.3 whereby a brown colloidal solution containing a hydrous oxide of molybdenum ($Mo^{+5}$) was obtained. The resultant brown colloidal solution wet both the polyethyleneterephthalate and the polytetrafluoroethylene surfaces. The resultant brown solution also functioned as a positive photosensitive sensitizer. A 2–5 $\mu$ inch electroless copper pattern was obtained as well as a 2–5 $\mu$ inch electroless nickel pattern.

EXAMPLE VI

The procedure of Example IV was repeated except that 0.1 to 5 weight percent of $Na_2WO_4 \cdot 2H_2O$ was employed with a reducing agent selected from $Sn^{+2}$ and $H_2NNH_2$ to obtain various blue, non-colloidal wetting solutions which did not exhibit a Tynall effect even upon dilution with water in a dilution of 5 to 1 but which rendered a hydrophobic surface hydrophilic. A 2–5 $\mu$ inch electroless copper pattern was obtained as well as a 2–5 $\mu$ inch electroless nickel pattern.

EXAMPLE VII

A colloidal, negative photosensitive sensitizer and activating solution was prepared by diluting by 5 to 1 with water a 5 weight percent $PdCl_2$ in 10 weight percent aqueous HCl solution. To the solution was added 0.5 to 2 weight percent $InCl_3$. The pH of the resultant solution was adjusted to about 4.2 with 1.0 normal aqueous NaOH. A colloidal solution comprising a hydrous oxide of at least Pd was obtained which wets a hydrophobic surface such as polyethyleneterephthalate. The resultant colloidal solution was allowed to age at 25°C for 30 minutes whereupon a commercially obtained polyethyleneterephthalate film was immersed therein for about 10 seconds at 25°C. The film was removed from the solution, rinsed with deionized water for one minute and dried. The film was then selectively exposed to a low-pressure mercury discharge lamp (total energy 50 millijoules/cm$^2$) through a negative mask. The mask had radiation-transmitting areas through which the ultraviolet radiation passed, which areas corresponded to a desired electroless metal-deposited pattern. The film was water rinsed and immersed in a commercially available electroless copper plating solution comprising cupric sulfate, formaldehyde, complexer and caustic, wherein an electroless copper pattern corresponding to exposed areas of the film and to radiation-transmitting areas of the mask, having a thickness of 2–5 $\mu$ inches was obtained.

For comparison purposes, a freshly prepared solution (not aged) was employed and exposed through a positive mask. An electroless copper pattern corresponding to unexposed areas of the film and to radiation opaque areas (shielding areas) of the mask, having a thickness of 2–5 $\mu$ inches was obtained.

EXAMPLE VII

The procedure of Example VI was repeated except that the negative sensitizer was prepared by first dissolving 0.28 weight percent of $PdCl_2$ in 2 to 20 weight percent aqueous HCl. Added to the resultant solution was 0.5 to 3 weight percent $Ce(NH_4)_2(NO_3)_2$. The mixture was then stirred for about 30 minutes until the evolution of gas was complete and a red precipitate which had formed redissolved. The pH of the resultant solution was adjusted with 1-N aqueous NaOH to a value of 1.5 to 3.0 whereby a colloidal solution comprising at least a hydrous oxide of Pd was obtained which wets a polyethyleneterephthalate surface. The resultant colloidal solution was allowed to age at 25°C for 30 minutes.

A 2–5 $\mu$ inch electroless copper pattern was obtained.

For comparison purposes, a freshly prepared solution (not aged) was employed and exposed through a positive mask. An electroless copper pattern corresponding to unexposed areas of the film and to radiation-opaque areas (shielding areas) of the mask, having a thickness of 2-5 $\mu$ inches, was obtained.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of rendering a surface of a substrate capable of having a metal deposited thereon which comprises, selectively exposing to a source of ultraviolet radiation a sensitized surface, treated with a solution comprising a sensitizer selected from (a) a colloidal solution comprising a hydrous oxide of at least one element of a combination comprising Pd and an element selected from In and Ce, (b) a colloidal solution comprising a hydrous oxide of Ni, (c) a colloidal solution comprising a hydrous oxide of Mn, (d) a colloidal solution comprising a hydrous oxide of U, (e) a colloidal solution comprising a hydrous oxide of Mo, (f) a non-colloidal solution comprising a dissolved tungstate salt and (g) a non-colloidal solution comprising a dissolved molybdate salt, to delineate a pattern capable of accomodating a reduction of a catalytic activating metal thereon.

2. A method of rendering an article selectively capable of reducing thereon a precious metal from a precious metal salt, which comprises:
coating the article with a photosensitive sensitizing solution selected from the group consisting of (a) a colloidal solution comprising a hydrous oxide of at least one element of a combination comprising Pd and an element selected from In and Ce, (b) a colloidal solution comprising a hydrous oxide of Ni, (c) a colloidal solution comprising a hydrous oxide of Mn, (d) a colloidal solution comprising a hydrous oxide of U, (e) a colloidal solution comprising a hydrous oxide of Mo, (f) a non-colloidal solution comprising a dissolved tungstate salt and (g) a non-colloidal solution comprising a dissolved molybdate salt;
drying said coated article to form a sensitizer region thereon; and
selectively exposing portions of said sensitizer region to a source of ultraviolet radiation to produce a pattern capable of having an activating metal reduced thereon.

3. The method as defined in claim 2 which further comprises, when said sentizing solution is one selected from (b) to (g), treating said radiation-exposed region with an activating metal ion to reduce and deposit an activating metal on said pattern.

4. The method as defined in claim 3 which further comprises treating said activating metal-deposited pattern with an electroless deposition solution to deposit an electroless metal thereon.

5. A method of depositing a metal pattern on a surface of a substrate, which comprises:
sensitizing the surface with a photosensitive sensitizer selected from the group of photosensitive sensitizers consisting of (a) a photosensitive Ni sensitizer, (b) a photosensitive Mn sensitizer, (c) a photosensitive U sensitizer, (d) a photosensitive Mo sensitizer, (e) a photosensitive W sensitizer and (f) a mixture thereof; and
selectively exposing said sensitized surface to a source of ultraviolet radiation to delineate a pattern capable of reducing an activating metal ion to an activating metal.

6. The method as defined in claim 5 which further comprises treating said delineated pattern to an activating metal ion to deposit an activating metal thereon.

7. The method as defined in claim 6 which further comprises treating said activating metal deposited pattern with an electroless metal solution to deposit an electroless metal thereon.

8. A method of depositing a metal pattern on a surface of a substrate, which comprises:
sensitizing the surface with a photosensitive sensitizer selected from the group consisting of (a) a photosensitive In-Pd sensitizer, (b) a photosensitive Ce-Pd sensitizer and (c) a mixture thereof; and
selectively exposing said sensitized surface to a source of ultraviolet radiation to delineate an exposed surface pattern corresponding to the desired metal pattern.

9. The method as defined in claim 8 which further comprises:
treating said exposed surface pattern with an electroless metal deposition solution to deposit an electroless metal thereon.

10. A method of selectively depositing a metal pattern on a surface of a substrate, which comprises:
coating the surface with an aged, stable aqueous colloidal solution, formed by a hydrolysis and nucleation reaction, comprising a species of combined elements of Pd and an element selected from In, Ce and a mixture thereof, said hydrolysis reaction including at least (1) dissolution of a salt of at least one of said elements in an aqueous medium and (2) maintenance of the pH of said aqueous medium at a point where no flocculate results;
exposing selected portions of said coated surface to a source of ultraviolet radiation to render a palladium species contained on said selected portions capable of being reduced to catalytic palladium metal, whereas unexposed portions are incapable of such reduction; and
immersing said selected portions in an electroless plating bath to (1) form catalytic palladium metal and (2) reduce an electroless metal thereon, said reduction being catalyzed by said formed catalytic palladium metal.

11. A method of producing an electrical circuit pattern on a non-conductive substrate, which comprises:
coating the substrate with a photosensitive sensitizer of an element selected from the group consisting of Ni, Mn, U, Mo, Wo and a mixture thereof;
selectively exposing said coated surface to a source of ultraviolet radiation to generate a first surface pattern conforming to the electrical circuit pattern, and a second surface pattern, said first surface pattern comprising a species of said selected element capable of reducing an activating metal ion to an activating metal, said second surface pattern comprising a species of said selected element incapable of reducing an activating metal ion to an activating metal;
exposing at least said first pattern to an activating metal ion to reduce and deposit an activating metal thereon; and
treating said activating metal-deposited pattern with an electroless plating bath, catalyzed by said activating metal, to deposit an electroless metal on said first surface pattern to produce the electrical circuit pattern.

12. The method as defined in claim 11 which comprises the additional step of electroplating metal onto the electrical circuit pattern.

13. The method as defined in claim 12 which comprises the additional step of removing the substrate from said electroplated circuit pattern.

14. A method of producing an electrical circuit pattern on a non-conductive substrate, which comprises:
coating the substrate with a photosensitive species selected from the group consisting of (a) a photosensitive In-Pd species, (b) a photosensitive Ce-Pd species and (c) a mixture thereof which is initially incapable of being reduced to catalytic palladium metal but which upon exposure to ultraviolet radiation is rendered capable of such reduction;

selectively exposing said coated substrate to a source of ultraviolet radiation to generate a first surface pattern conforming to the electrical circuit pattern, and a second surface pattern, said first surface pattern comprising an ultraviolet radiation rendered species thereon capable of reduction to catalytic palladium metal, said second surface pattern comprising said initial species thereon incapable of reduction to catalytic palladium metal; and immersing said selectively exposed substrate in an electroless plating bath, catalyzed by catalytic palladium metal, to deposit electroless metal on said first surface pattern to produce the electrical circuit pattern.

15. The method as defined in claim 14 which comprises the additional step of electroplating metal onto the electrical circuit pattern.

16. The method as defined in claim 15 which comprises the additional step of removing the substrate from said electroplated circuit pattern.

17. A method of depositing a metal pattern on a surface of a substrate, which comprises:
coating the surface with a positive photosensitive sensitizer selected from a photosensitive species of an element selected from the group consisting of Ni, Mn, U, Mo, W and a mixture thereof;
selectively exposing at least one portion of said coated surface to a source of ultraviolet radiation to render said at least one exposed portion of the surface incapable of reducing an activating metal ion to an activating metal and to delineate an unexposed surface pattern; and
treating said selectively radiation exposed surface with an activating metal ion to reduce an deposit an activating metal only on said delineated unexposed surface pattern.

18. The method as defined in claim 17 which further comprises treating said activating metal-deposited pattern with an electroless metal deposition solution to deposit an electroless metal thereon.

19. A method of depositing a metal pattern on a surface of a substrate, which comprises:
coating the surface with a negative photosensitive sensitizer comprising a photosensitive species of Pd combined with an element selected from In, Ce and a mixture thereof;
selectively exposing said coated surface to a source of ultraviolet radiation to render at least one exposed portion capable of having reduced thereon catalytic palladium whereas unexposed portions remain incapable of having reduced thereon catalytic palladium; and
treating said at least one exposed portion with an electroless metal deposition solution to deposit an electroless metal thereon.

20. A method of rendering a hydrophobic surface hydrophilic which comprises, treating the surface with an aqueous, non-colloidal solution comprising a dissolved salt selected from a tungstate salt and a molybdate salt.

21. The method as defined in claim 2 which further comprises, when said sensitizing solution comprises (a), treating said radiation-exposed region with an electroless metal deposition solution to deposit an electroless metal thereon.

22. A method of depositing a metal on a surface of a substrate which comprises selectively exposing to a source of ultraviolet radiation a sensitized surface, treated with a solution comprising a sensitizer selected from (a) a colloidal solution comprising a hydrous oxide of Ni, (b) a colloidal solution comprising a hydrous oxide of Mn, (c) a colloidal solution comprising a hydrous oxide of U, (d) a colloidal solution comprising a hydrous oxide of Mo, (e) a non-colloidal solution comprising a dissolved inorganic tungstate salt, (f) a non-colloidal solution comprising a dissolved inorganic molybdate salt, and (g) a colloidal solution comprising a hydrous oxide of at least one element of a combination comprising Pd and an element selected from In and Ce, to delineate a pattern capable of accomodating a reduction of a metal; and
treating said delineated pattern with a solution, capable of having a metal reduced therefrom, selected from the group consisting of ($a^1$) a solution comprising an activating metal ion when said sensitizing solution is one selected from (a) to (f), or ($b^1$) an electroless metal deposition solution when said sensitizing solution comprises (g), to reduce and deposit a metal on said pattern.

23. The method as defined in claim 22 which further comprises, when said sensitizing solution is one selected from (a) to (f), treating said reduced metal pattern with an electroless metal plating solution to deposit an electroless metal deposit thereon.

24. A method of rendering an article selectively capable of reducing thereon a precious metal from a precious metal salt, which comprises:
coating the article with a photosensitive sensitizing solution selected from the group consisting of (a) a colloidal solution comprising a hydrous oxide of at least one element of a combination comprising Pd and an element selected from In and Ce, (b) a colloidal solution comprising a hydrous oxide of Ni, (c) a colloidal solution comprising a hydrous oxide of Mn, and (d) a colloidal solution comprising a hydrous oxide of U;
drying said coated article to form a sensitizer region thereon; and
selectively exposing portions of said sensitizer region to a source of ultraviolet radiation to delineate a pattern capable of having an activating metal reduced thereon.

* * * * *

UNITED STATES PATENT OFFICE
CERTIFICATE OF CORRECTION

Patent No. 3,950,570          Dated   April 13, 1976

Inventor(s)   John T. Kenney

It is certified that error appears in the above-identified patent and that said Letters Patent are hereby corrected as shown below:

In the Abstract, line 12, "an activation" should read --an activating--.

In the specification, Column 1, line 21, "combination" should read --combinations--; line 44, "nulceating" should read --nucleating--; line 54, "at al." should read --et al.--; line 55, "at al" should read --et al.--. Column 2, line 15, "substrate" should read --surface--; line 23, "disclosed" should read --discloses--. Column 5, lines 18 and 19, "mamn-ner" should read --manner--; line 32, "Zn0" should read --Zn°--; lines 35 and 36, "Mo+5--Mo+6" should read --Mo+5-Mo+6--. Column 6, line 37, "cerium wetting" should read --cerium-palladium wetting--; line 66, ")OH)" should read --(OH)--. Column 8, line 41, "250°C" should read --25°C--. Column 10, line 11, "wavelengths" should read --wavelength--; line 61, "(2) and" should read --(2) an--; line 63, "Cu, Ni" should read --Cu°, Ni°--; line 68, "Cu, Ni" should read --Cu°, Ni°--. Column 11, line 23, "is to" should read --is also to--. Column 13, line 10, "a well" should read --as well--; line 25, "(Crcl2)" should read --(CrCl2)--. Column 14, line 37, "Example VII" should read --Example VIII--.

In the claims, Column 15, claim 3, line 39, "sentizing" should read --sensitizing--. Column 17, claim 17, line 41, "reduce an" should read --reduce and--.

Signed and Sealed this

Thirteenth Day of July 1976

[SEAL]

Attest:

RUTH C. MASON
Attesting Officer

C. MARSHALL DANN
Commissioner of Patents and Trademarks